United States Patent
Han et al.

(10) Patent No.: US 8,679,920 B2
(45) Date of Patent: Mar. 25, 2014

(54) SEMICONDUCTOR DEVICES HAVING STACKED STRUCTURES AND A LAYER FORMED THEREON TAPERED IN DIRECTION OPPOSITE OF A TAPERING OF THE STACKED STRUCTURES AND METHODS OF FABRICATING THE SAME

(75) Inventors: Hauk Han, Hwaseong-si (KR); Byoung-Kyu Lee, Seoul (KR); Jingi Hong, Yongin-si (KR); Changwon Lee, Seongnam-si (KR); Eungjoon Lee, Yongin-si (KR); Je-Hyeon Park, Suwon-si (KR); Jeonggil Lee, Goyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 69 days.

(21) Appl. No.: 13/273,935

(22) Filed: Oct. 14, 2011

(65) Prior Publication Data
US 2012/0094453 A1    Apr. 19, 2012

(30) Foreign Application Priority Data
Oct. 14, 2010  (KR) .................. 10-2010-0100465

(51) Int. Cl.
*H01L 21/336*    (2006.01)

(52) U.S. Cl.
USPC  438/269; 438/287; 257/E21.41; 257/E21.423

(58) Field of Classification Search
USPC ............. 257/324, E21.41, E21.423; 438/269, 438/287
See application file for complete search history.

(56) References Cited

U.S. PATENT DOCUMENTS

| | | | |
|---|---|---|---|
| 6,977,220 B2 * | 12/2005 | Marieb et al. | 438/659 |
| 7,776,694 B2 | 8/2010 | Jang et al. | |
| 8,258,033 B2 * | 9/2012 | Watanabe | 438/283 |
| 2003/0057099 A1 * | 3/2003 | Guldi et al. | 205/291 |
| 2009/0004848 A1 | 1/2009 | Kim et al. | |
| 2009/0163025 A1 | 6/2009 | Humayun et al. | |
| 2009/0218616 A1 | 9/2009 | Jang et al. | |
| 2010/0207185 A1 * | 8/2010 | Lee et al. | 257/314 |
| 2010/0308403 A1 | 12/2010 | Jang et al. | |
| 2011/0057251 A1 * | 3/2011 | Higashi | 257/324 |

FOREIGN PATENT DOCUMENTS

| | | |
|---|---|---|
| JP | 2009152612 A | 7/2009 |
| KR | 20080084277 A | 9/2008 |
| KR | 10-0890047 B1 | 3/2009 |
| KR | 20090093101 A | 9/2009 |

* cited by examiner

*Primary Examiner* — Robert Huber
(74) *Attorney, Agent, or Firm* — Harness, Dickey & Pierce, P.L.C.

(57) ABSTRACT

Semiconductor devices and methods of fabricating semiconductor devices that may include forming an insulation structure including insulation patterns that are sequentially stacked and vertically separated from each other to provide gap regions between the insulation patterns, forming a first conductive layer filling the gap regions and covering two opposite sidewalls of the insulation structure, and forming a second conductive layer covering the first conductive layer. A thickness of the second conductive layer covering an upper sidewall of the insulation structure is greater than a thickness of the second conductive layer covering a lower sidewall of the insulation structure.

16 Claims, 12 Drawing Sheets

SEMICONDUCTOR DEVICES HAVING STACKED STRUCTURES AND A LAYER FORMED THEREON TAPERED IN DIRECTION OPPOSITE OF A TAPERING OF THE STACKED STRUCTURES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2010-0100465, filed on Oct. 14, 2010, in the Korean Intellectual Property Office (KIPO) the entire contents of which is incorporated herein by reference.

BACKGROUND

1. Field

Example embodiments relate to semiconductor devices and methods of fabricating the same.

2. Description of Related Art

As the electronic industry becomes more highly developed, integration density of semiconductor memory devices gradually increases. Integration density of semiconductor memory devices may act as an important factor that influences costs of the semiconductor memory devices. The higher the integration density of the semiconductor memory devices, the lower the cost.

In general, the integration density of two dimensional semiconductor memory devices (e.g., planar semiconductor memory devices) may be determined by a planar area that a unit cell of the semiconductor memory devices occupies. Accordingly, the integration density of the semiconductor memory devices may be affected by a process technology for forming fine and small patterns. However, realizing fine patterns in two dimensional semiconductor memory devices may result in increasing manufacturing costs and/or high priced apparatuses. Therefore, there may be some limitations in increasing the integration density of the two dimensional semiconductor memory devices. Three dimensional semiconductor devices including memory cells arranged in a three dimensional array have been proposed to increase integration density.

SUMMARY

According to example embodiments, there may be provided methods of fabricating semiconductor devices and semiconductor devices fabricated thereby.

According to at least one example embodiment, a method of fabricating semiconductor devices includes forming an insulation structure including insulation patterns that are sequentially stacked and vertically separated from each other to provide gap regions between the insulation patterns, forming a first conductive layer filling the gap regions and covering two opposite sidewalls of the insulation structure, and forming a second conductive layer covering the first conductive layer. A thickness of the second conductive layer covering an upper sidewall of the insulation structure is greater than a thickness of the second conductive layer covering a lower sidewall of the insulation structure.

According to at least one example embodiment, the opposite sidewalls of the insulation structure may be formed to have a positive sloped profile so that a top width of the insulation structure is less than a bottom width of the insulation structure, and the second conductive layer may be formed to have two opposite sidewalls steeper than the opposite sidewalls of the insulation structure. According to at least one example embodiment, the first and second conductive layers may include the same material. According to at least one example embodiment, forming the first conductive layer may include forming a seed layer covering inner surfaces of the gap regions and forming a bulk layer on the seed layer to fill the gap regions. The second conductive layer and the seed layer may be formed using an atomic layer deposition process.

According to at least one example embodiment, a process gas used in formation of the second conductive layer may be different from a process gas used in formation of the seed layer. According to at least one example embodiment, the method may include isotropically etching the first and second conductive layers to form gate electrodes in the gap regions. The gate electrodes may be formed of remaining portions of the first conductive layer, and each of the gate electrodes may fill at least a portion of one of the gap regions. According to at least one example embodiment, the first conductive layer may be formed of a different material from the second conductive layer.

According to at least one example embodiment, the first and second conductive layers may be etched at substantially the same etch rate while the first and second conductive layers are isotropically etched. According to at least one example embodiment, each of the gap regions may have an empty region that is not filled with the gate electrode, and a width of the empty region located at a relatively high level may be less than a width of the empty region located at a relatively low level. According to at least one example embodiment, the first conductive layer may be formed to completely fill the gap regions. According to at least one example embodiment, the method may include forming a barrier layer in the gap regions prior to formation of the first conductive layer. The barrier layer may include the same material as the second conductive layer.

According to at least one example embodiment, a deposition rate of the second conductive layer is reduced toward the substrate during formation of the second conductive layer so that a thickness of the second conductive layer formed on an upper portion of the insulation structure is greater than a thickness of the second conductive layer formed on a lower portion of the insulation structure. According to at least one example embodiment, forming the insulation structure may include alternately and repeatedly forming insulation layers and sacrificial layers on the substrate, patterning the insulation layers and the sacrificial layers to form trenches defining insulation patterns and sacrificial patterns which are alternately and repeatedly stacked, and removing the sacrificial patterns to form gap regions.

According to at least one an example embodiment, the method may include forming a semiconductor pillar that penetrates the insulation layers and the sacrificial layers to contact the substrate prior to formation of the trenches, and forming a data storage layer in the gap regions prior to formation of the first conductive layer. According to other example embodiments, the semiconductor device includes insulation patterns sequentially stacked on a substrate and separated from each other, gate electrodes in respective ones of gap regions between the insulation patterns, each of the gate electrodes filling at least a portion of one of the gap regions, and a semiconductor pillar penetrating the insulation patterns. The gap regions include a first gap region and a second gap region under the first gap region, and a volume ratio of the gate electrode in the first gap region to the first gap region is higher than a volume ratio of the gate electrode in the second gap region to the second gap region.

According to at least one example embodiment, the semiconductor device may include first and second insulation materials disposed in respective ones of the first and second gap regions. The gate electrodes may be disposed between the semiconductor pillar and the insulation materials, and a volume ratio of the first insulation material to the first gap region may be lower than a volume ratio of the second insulation material to the second gap region. According to at least one example embodiment, a width of the first gap region may be less than a width of the second gap region, the gate electrodes may have substantially the same width. A width of the first insulation material may be less than a width of the second insulation material.

According to at least one example embodiment, each of the gate electrodes may have a first sidewall adjacent to the semiconductor pillar and a second sidewall opposite the first sidewall, and the second sidewalls of the gate electrodes may be located in a vertical flat plane. According to at least one example embodiment, a width of the insulation pattern located at a relatively high level may be less than a width of the insulation pattern located at a relatively low level, and the gate electrodes may have substantially the same width.

According to at least one example embodiment, a method of manufacturing a semiconductor device includes stacking at least three vertically separated first insulation layers on a substrate layer, forming a plurality of vertical channels through the first insulation layers, removing a portion of the first insulation layers between the vertical channels to form a plurality of insulation patterns that decrease in width as a function of distance from the substrate layer, forming a plurality of gate layers on the vertical channels and the insulation patterns to form a plurality of tapered vertical structures, forming a sacrificial layer that increases in width as a function of distance from the substrate layer on the tapered vertical structures, and removing at least a portion of the sacrificial layer and at least one of the gate layers at about a same rate to form a plurality of gate electrodes of about a same width between the insulation patterns.

According to at least one example embodiment, a semiconductor device includes a substrate layer, a first insulation pattern on the substrate layer, a first gate electrode on the first insulation pattern, a second insulation pattern on the first gate electrode, the first gate electrode in a first gap region between the first and second insulation patterns, a second gate electrode on the second insulation pattern, a third insulation pattern on the second gate electrode, the second gate electrode in a second gap region between the second and third insulation patterns, a volume ratio of the second gate electrode to the second gap region greater than a volume ratio of the first gate electrode to the first gap region, and a semiconductor pillar penetrating the first, second and third insulation patterns.

According to at least one example embodiment, a method of fabricating a semiconductor device includes forming an insulation structure including vertically stacked insulation patterns separated from each other by gap regions, forming a first conductive layer in the gap regions and on a sidewall of the insulation structure, and forming a second conductive layer covering the first conductive layer such that a thickness of the second conductive layer on a first end of the sidewall is greater than a thickness of the second conductive layer on a second end of the sidewall.

BRIEF DESCRIPTION OF THE DRAWINGS

Example embodiments will be more clearly understood from the following brief description taken in conjunction with the accompanying drawings.

FIGS. 1-9 are perspective diagrams illustrating methods of fabricating semiconductor devices according to example embodiments;

FIG. 10 is an enlarged diagram illustrating a portion 'A' of FIG. 6;

FIG. 11 is a schematic block diagram illustrating electronic systems including semiconductor devices according to example embodiments; and FIG. 12 is a schematic block diagram illustrating memory cards including semiconductor devices according to example embodiments.

Figure 1:
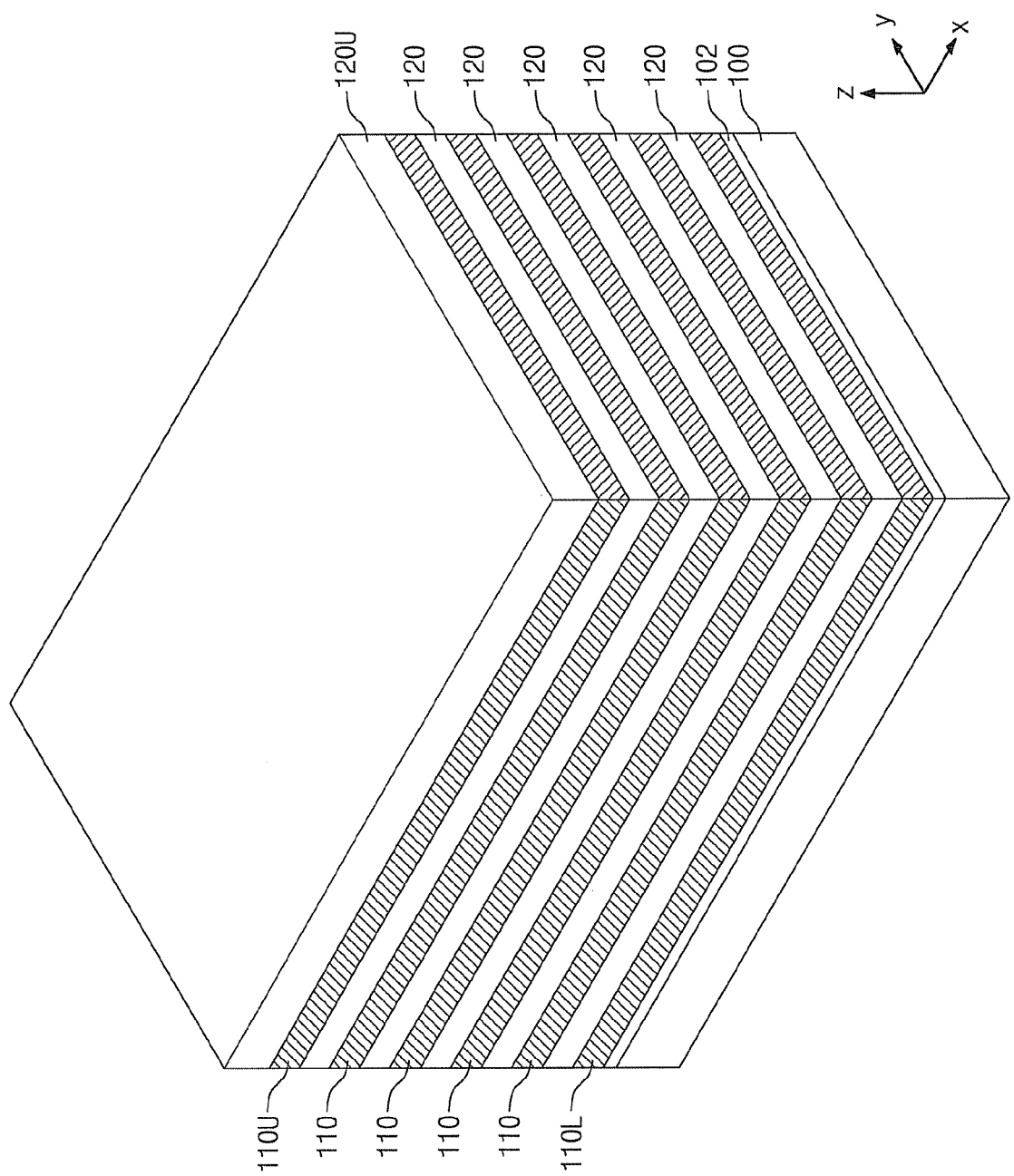
FIGS. 1-12 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1-9 are perspective diagrams illustrating methods of fabricating semiconductor devices according to example embodiments. Referring to FIG. 1, a substrate 100 may be provided. The substrate 100 may be a semiconductor substrate. For example, the substrate 100 may be a silicon substrate, a germanium substrate, a silicon-germanium substrate and/or a compound semiconductor substrate. The substrate 100 may be doped with dopants of a first conductivity type.

First material layers and second material layers different from the first material layers may be alternately and repeatedly stacked on the substrate 100. The first material layers may correspond to sacrificial layers 110L, 110 and 110U, and the second material layers may correspond to insulation layers 120 and 120U. The sacrificial layers 110L, 110 and 110U may include a material with etch selectivity to the insulation layers 120 and 120U. For example, the insulation layers 120 and 120U may be an oxide layer, and the sacrificial layers 110L, 110 and 110U may be a nitride layer and/or an oxynitride layer. The sacrificial layers 110L, 110 and 110U may be of a same material. The insulation layers 120 and 120U may be of a same material.

A thickness of each of the sacrificial layers 110L, 110 and 110U may be the same thickness. According to at least one example embodiment, the lowermost sacrificial layer 110L and the uppermost sacrificial layer 110U of the sacrificial layers may be thicker than the sacrificial layers 110 between the lowermost sacrificial layer 110L and the uppermost sacrificial layer 110U. According to at least one example embodiment, a thickness of the sacrificial layers 110 between the lowermost and uppermost sacrificial layers 110L and 110U may be the same thickness. The uppermost insulation layer 120U of the insulation layers may be thicker than the insulation layers 120 under the uppermost insulation layer 120U. According to at least one example embodiment, a thickness of each of the insulation layers 120 under the uppermost insulation layer 120U may be the same thickness.

A buffer dielectric layer 102 may be formed on the substrate 100 (e.g., prior to formation of the sacrificial layers 110L, 110 and 110U and the insulation layers 120 and 120U). The sacrificial layers 110L, 110 and 110U and the insulation layers 120 and 120U may be formed on the buffer dielectric layer 102 on a side opposite the substrate 100. The lowermost sacrificial layer 110L may be formed directly on the buffer dielectric layer 102 on a side opposite the substrate 100. The buffer dielectric layer 102 may be a dielectric layer with etch selectivity to the sacrificial layers 110L, 110 and 110U. For example, the buffer dielectric layer 102 may be an oxide layer (e.g., a thermal oxide layer).

Figure 2:
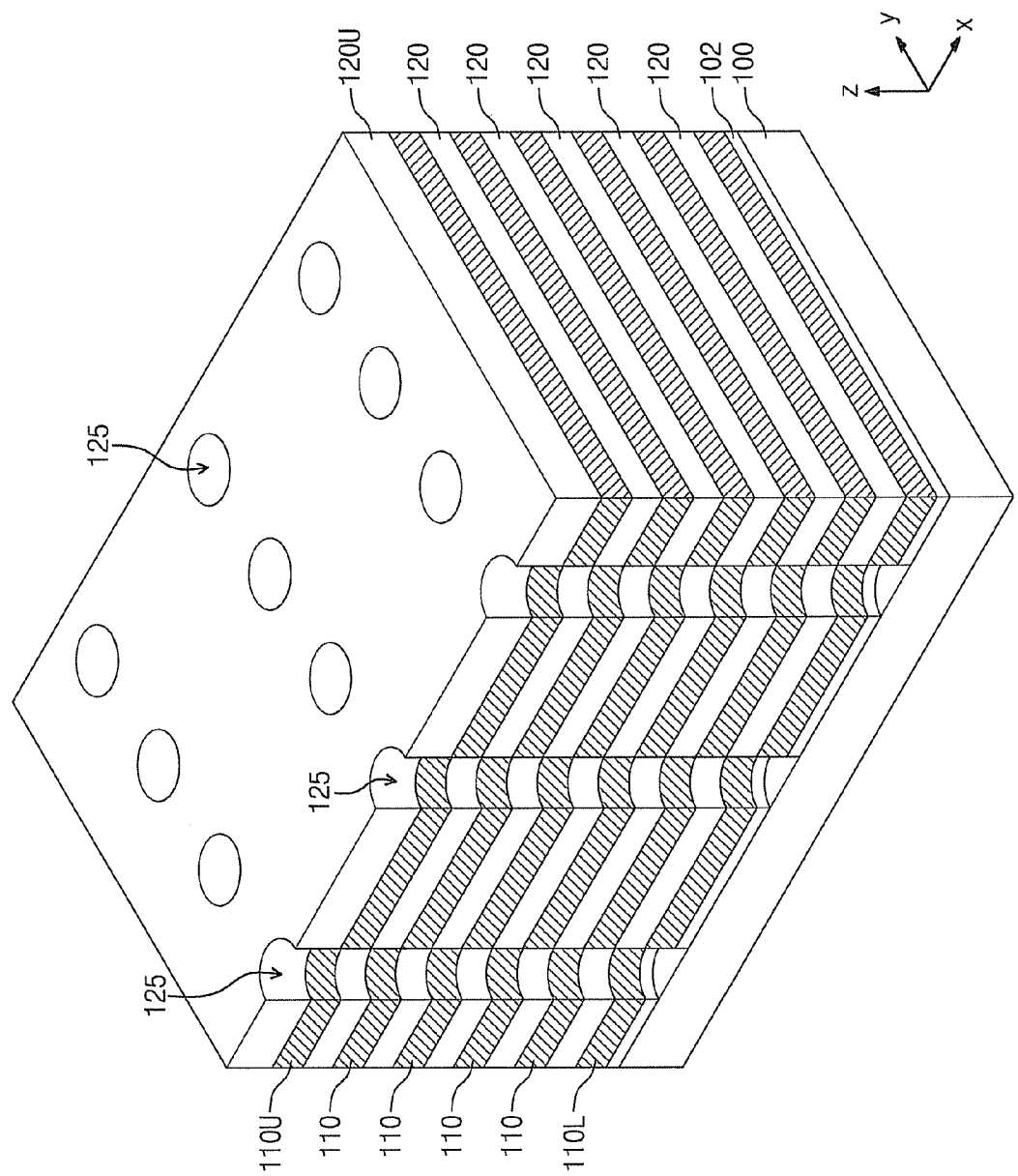

Referring to FIG. 2, the insulation layers 120 and 120U, the sacrificial layers 110L, 110 and 110U, and the buffer dielectric layer 102 may be patterned to form channel openings 125 that expose portions of the substrate 100. The channel openings 125 may be fondled using, for example, an anisotropic etch process. The channel openings 125 may be formed in, for example, a hole shape. The channel openings 125 may be formed to be spaced apart from each other. The channel openings 125 may be two dimensionally arrayed along a first direction and a second direction perpendicular to the first direction. Both the first and second directions may be parallel to a top surface of the substrate 100. In the drawings, an x-axis may be parallel with the first direction, and a y-axis may be parallel with the second direction. The first direction may correspond to an x-axis direction, and the second direction may correspond to a y-axis direction. The channel openings 125 may be a circular shape, an oval shape and/or a polygonal shape in a plan view.

Figure 3:
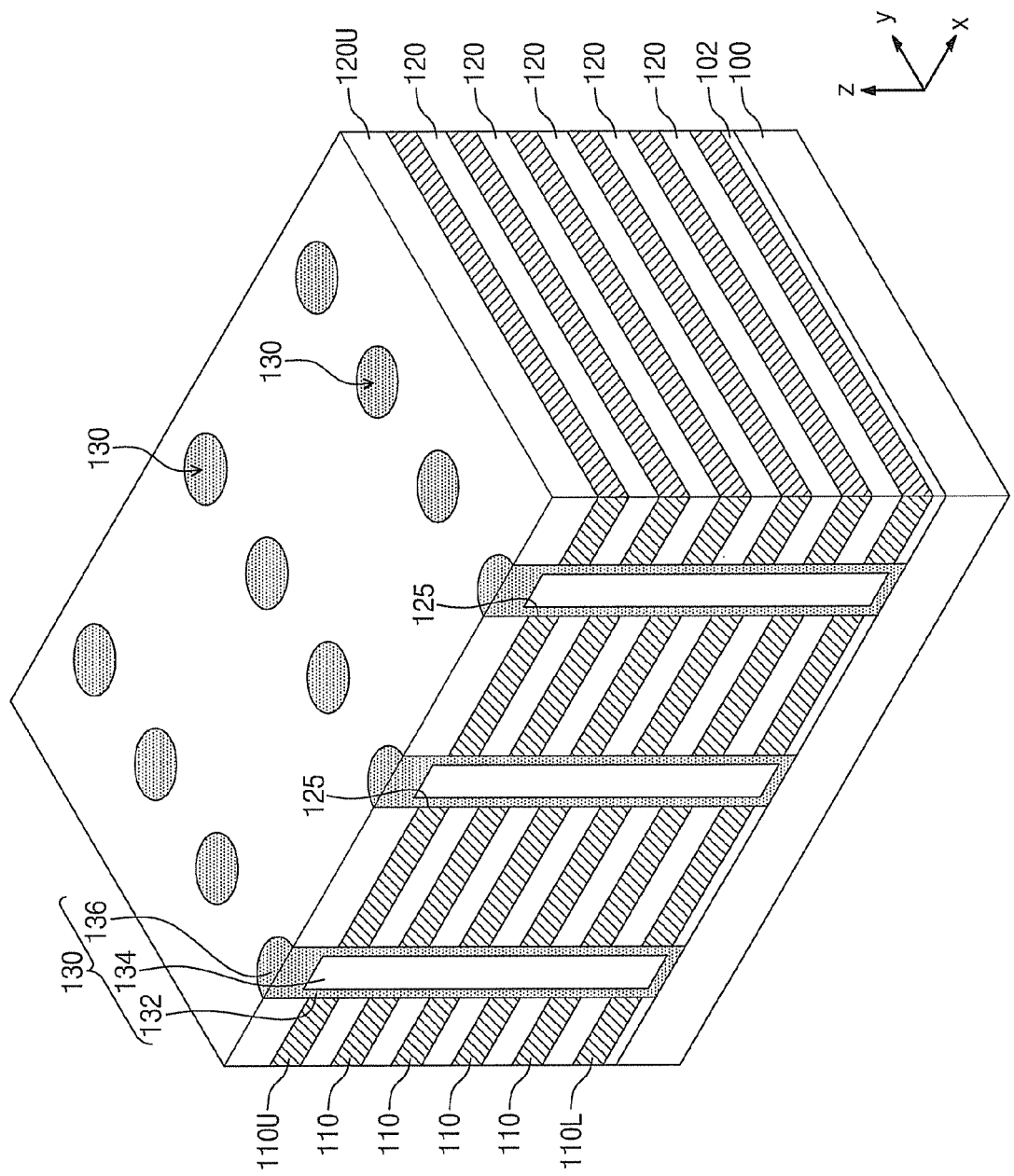

Referring to FIG. 3, semiconductor pillars 130 may be formed in the channel openings 125. The semiconductor pillars 130 may be formed to contact portions of the top surface of the substrate 100, which may correspond to bottom surfaces inside the openings 125. Forming the semiconductor pillars 130 may include forming semiconductor layers 132 covering sidewalls and bottom surfaces of the openings 125, filling inner spaces surrounded by the semiconductor layers 132 in the openings 125 with insulation patterns 134, removing upper portions of the filling insulation patterns 134 to form recessed regions in upper regions of the openings 125, and filling the recessed regions with drain regions 136 including semiconductor materials doped with dopants of a second conductivity type. Each of the semiconductor pillars 130 may be formed to include the semiconductor layer 132, the filling insulation pattern 134 and the drain region 136.

Figure 4:
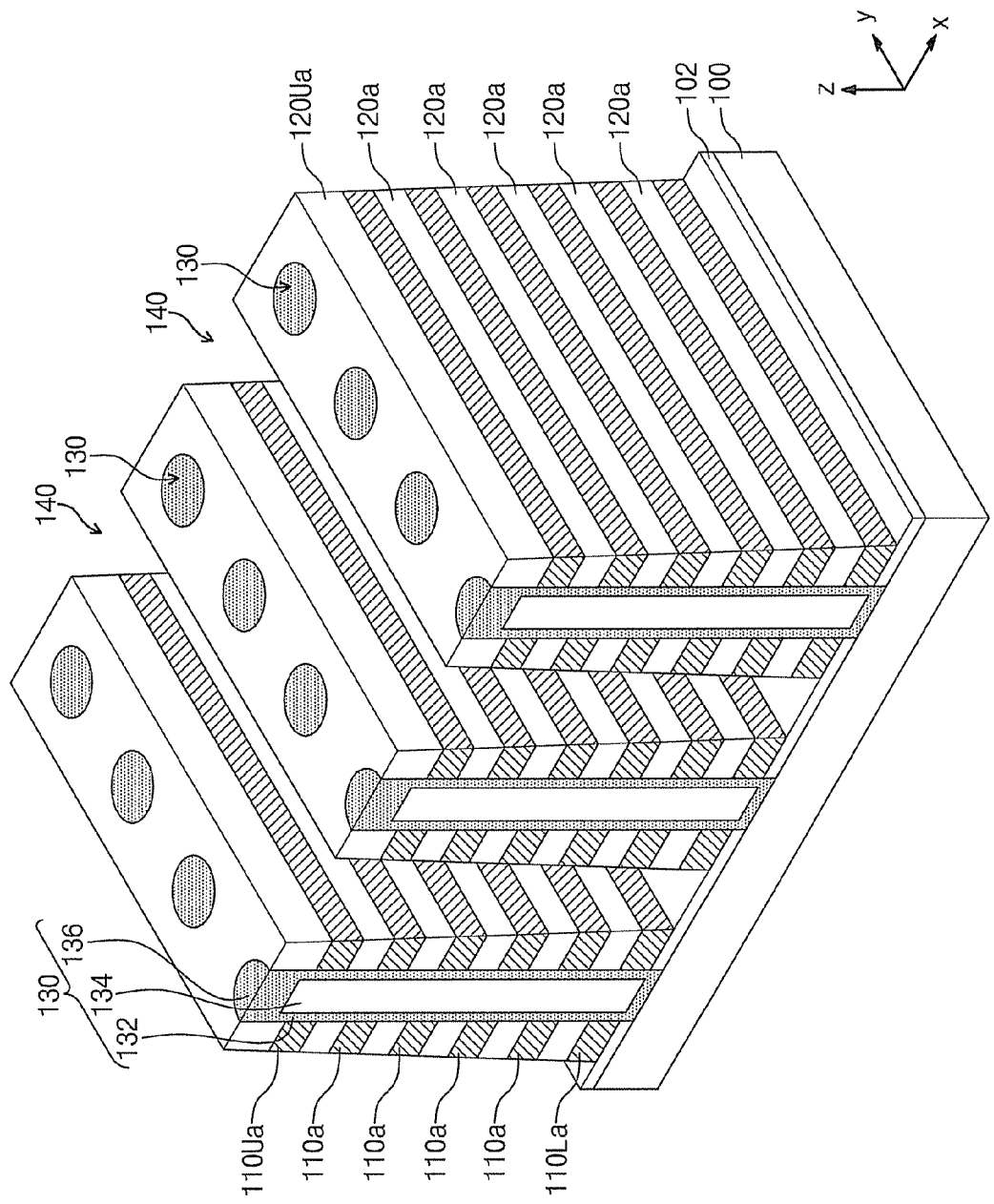
Figure 5:
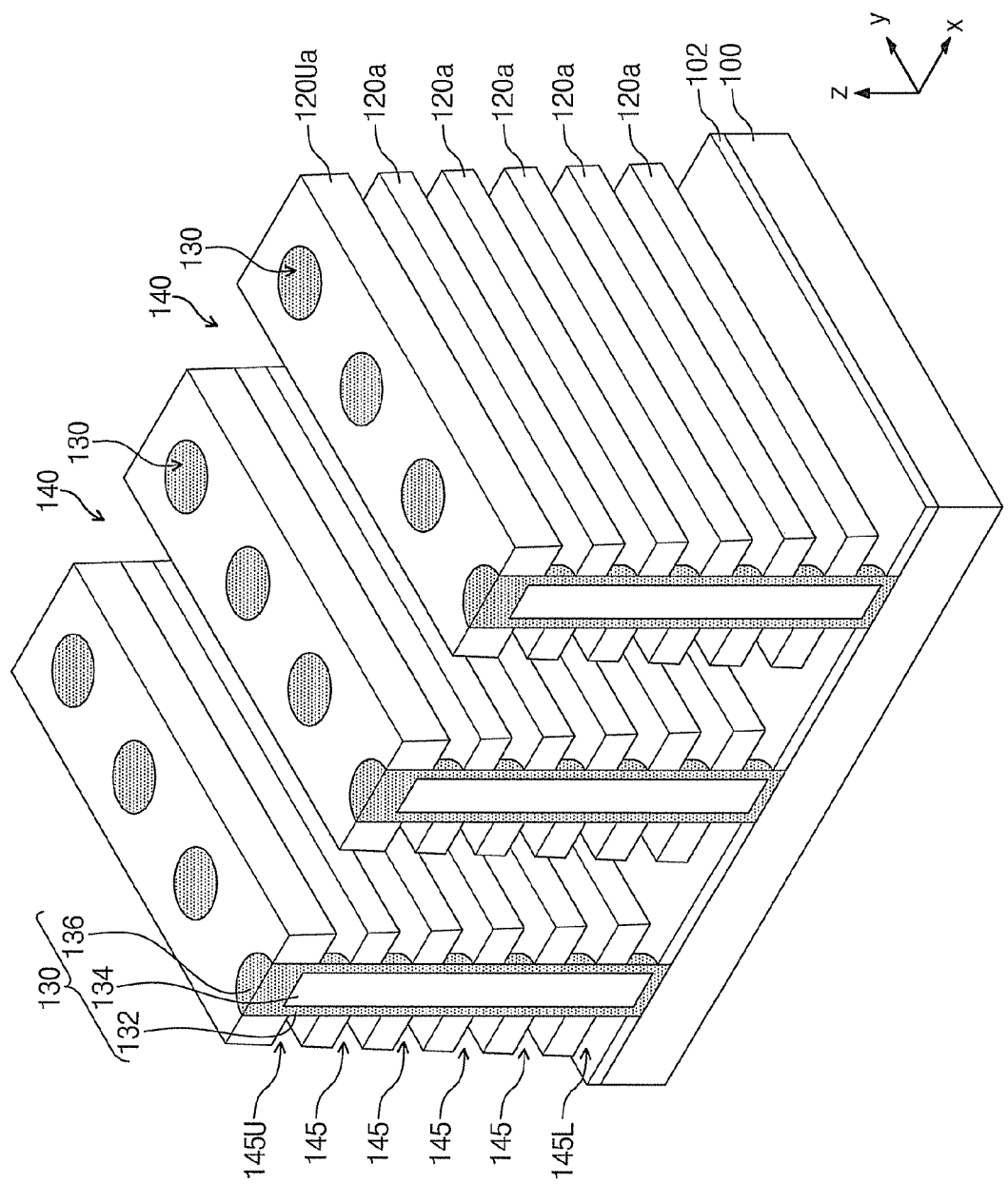

Referring to FIG. 4, the insulation layers 120 and 120U and the sacrificial layers 110L, 110 and 110U may be patterned to form trenches 140. The trenches 140 may be formed to extend in the second direction (e.g., the y-axis direction). A plurality of preliminary stacked structures separated from each other in the first direction may be formed by the trenches 140. Each of the preliminary stacked structures may be formed to include sacrificial patterns 110La, 110a and 110Ua, and insulation patterns 120a and 120Ua which are alternately and repeatedly stacked. The trenches 140 may be formed using, for example, an anisotropic etch process. The sacrificial patterns 110La, 110a and 110Ua and the insulation patterns 120a and 120Ua may also be formed to be a line shape extending in the second direction.

The semiconductor pillars 130 arrayed in a straight line parallel with the first direction (e.g., the x-axis direction) may constitute a row, and the semiconductor pillars 130 arrayed in a straight line parallel with the second direction (e.g., the y-axis direction) may constitute a column. All the semiconductor pillars 130 may be two dimensionally arrayed along the rows and the columns on the substrate 100. Each of the trenches 140 may be formed between the pair of adjacent columns. The plurality of semiconductor pillars 130 arrayed in one of the columns may penetrate one of the preliminary stacked structures, While the insulation layers 120 and 120U and the sacrificial layers 110L, 110 and 110U may be patterned using an etch process to form the trenches 140, byproducts may be generated because of nature of the etch process. The etch byproducts may have a solid state and/or a gas state. The etch byproducts in a gas state may be removed during the etch process. The etch byproducts in a solid state may be adsorbed on sidewalls of etched regions in the insulation layers 120 and 120U and the sacrificial layers 110L, 110 and 110U. The etch byproducts adsorbed on the sidewalls of the etched regions may act as etch masks during the etch process for forming the trenches 140. A width (e.g., a distance along the x-axis) of the trenches 140 may be gradually reduced toward the substrate 100.

In each preliminary stacked structure, a width (e.g., a distance along the x-axis) of the insulation pattern located at a relatively high level may be less than a width (e.g., a distance along the x-axis) of the insulation pattern located at a relatively low level. In each preliminary sacked structure, a width (e.g., a distance along the x-axis) of the sacrificial pattern located at a relatively high level may be less than a width (e.g., a distance along the x-axis) of the sacrificial pattern located at a relatively low level. A width (e.g., a distance along the x-axis) of the preliminary stacked structure may gradually increase toward the substrate 100. A top width (e.g., a distance along the x-axis) of the trenches 140 may be greater than a bottom width (e.g., a distance along the x-axis) of the trenches 140.

The trenches 140 may expose sidewalls of the sacrificial patterns 110La, 110a and 110Ua and the insulation patterns 120a and 120Ua constituting the preliminary stacked structures. Portions of the buffer dielectric layer 102 may be exposed by the trenches 140. According to at least one example embodiment, during formation of the trenches 140, the buffer dielectric layer 102 may be etched to expose portions of the substrate 100. For the purpose of ease and convenience in explanation, it may be assumed that bottom surfaces in the trenches 140 correspond to portions of a top surface of the buffer dielectric layer 102.

Before patterning the insulation layers 120 and 120U and the sacrificial layers 110L, 110 and 110U to form the trenches 140, an insulating dielectric layer (not shown) including the same material as the insulation layers 120 and 120U may be formed on the uppermost insulation layer 120U and the semiconductor pillars 130. In this case, the insulating dielectric layer may also be patterned together with the insulation layers 120 and 120U and the sacrificial layers 110L, 110 and 110U while the trenches 140 are formed, Referring to FIG. 5, the sacrificial patterns 110La, 110a and 110Ua may be selectively removed to form gap regions 145L, 145 and 145U between the insulation patterns 120a and 120Ua which are vertically adjacent to each other. A plurality of insulation structures may be formed, and each of the insulation structures may include the insulation patterns 120a and 120Ua which are sequentially stacked and vertically separated from each other. As described with reference to FIG. 4, the width (e.g., a distance along the x-axis) of the insulation pattern located at a relatively high level may be less than the width (e.g., a distance along the x-axis) of the insulation pattern located at a relatively low level. A top width (e.g., a distance along the x-axis) of each insulation structure may be less than a bottom width (e.g., a distance along the x-axis) thereof, and both sidewalls of the insulation structures may be formed to have a positive slope.

As described with reference to FIG. 4, the width (e.g., a distance along the x-axis) of the sacrificial pattern located at a relatively high level may be less than the width (e.g., a distance along the x-axis) of the sacrificial pattern located at a relatively low level. A width (e.g., a distance along the x-axis) of the gap region located at a relatively high level may be less than a width (e.g., a distance along the x-axis) of the gap region located at a relatively low level. The width of the gap region may be gradually increased as it becomes closer to the substrate 100.

The sacrificial patterns 110La, 110a and 110Ua may be selectively removed using, for example, an isotropic etch process. The isotropic etch process may include a wet etch process and/or an isotropic dry etch process. During the isotropic etch process for selectively removing the sacrificial patterns 110La, 110a and 110Ua, an etch rate of the sacrificial patterns 110La, 110a and 110Ua may be greater than those of the insulation patterns 120a and 120Ua, the buffer dielectric layer 102 and the semiconductor pillars 130. After the sacrificial patterns 110La, 110a and 110Ua are selectively removed, the insulation patterns 120a and 120Ua, the buffer dielectric layer 102 and the semiconductor pillars 130 may still exist.

In each insulation structure, the gap regions 145L, 145 and 145U may expose portions of a sidewall of the semiconductor pillar 130. Removal of the lowermost sacrificial patterns 110La may result in formation of the lowermost gaps 145L, and removal of the uppermost sacrificial patterns 110Ua may result in formation of the uppermost gaps 145U. Removal of the sacrificial patterns 110a between the lowermost sacrificial patterns 110La and the uppermost sacrificial patterns 110Ua may result in formation of the gaps 145 between the lowermost gaps 145L and the uppermost gaps 145U.

Bottom surfaces in the lowermost gap regions 145L may correspond to portions of the top surface of the buffer dielectric layer 102. According to at least one example embodiment, during the isotropic etch process for selectively removing the sacrificial patterns 110La, 110a and 110Ua, the buffer dielectric layer 102 being thinner than the insulation patterns 120a and 120Ua may also be removed to expose the substrate 100

Figure 6:
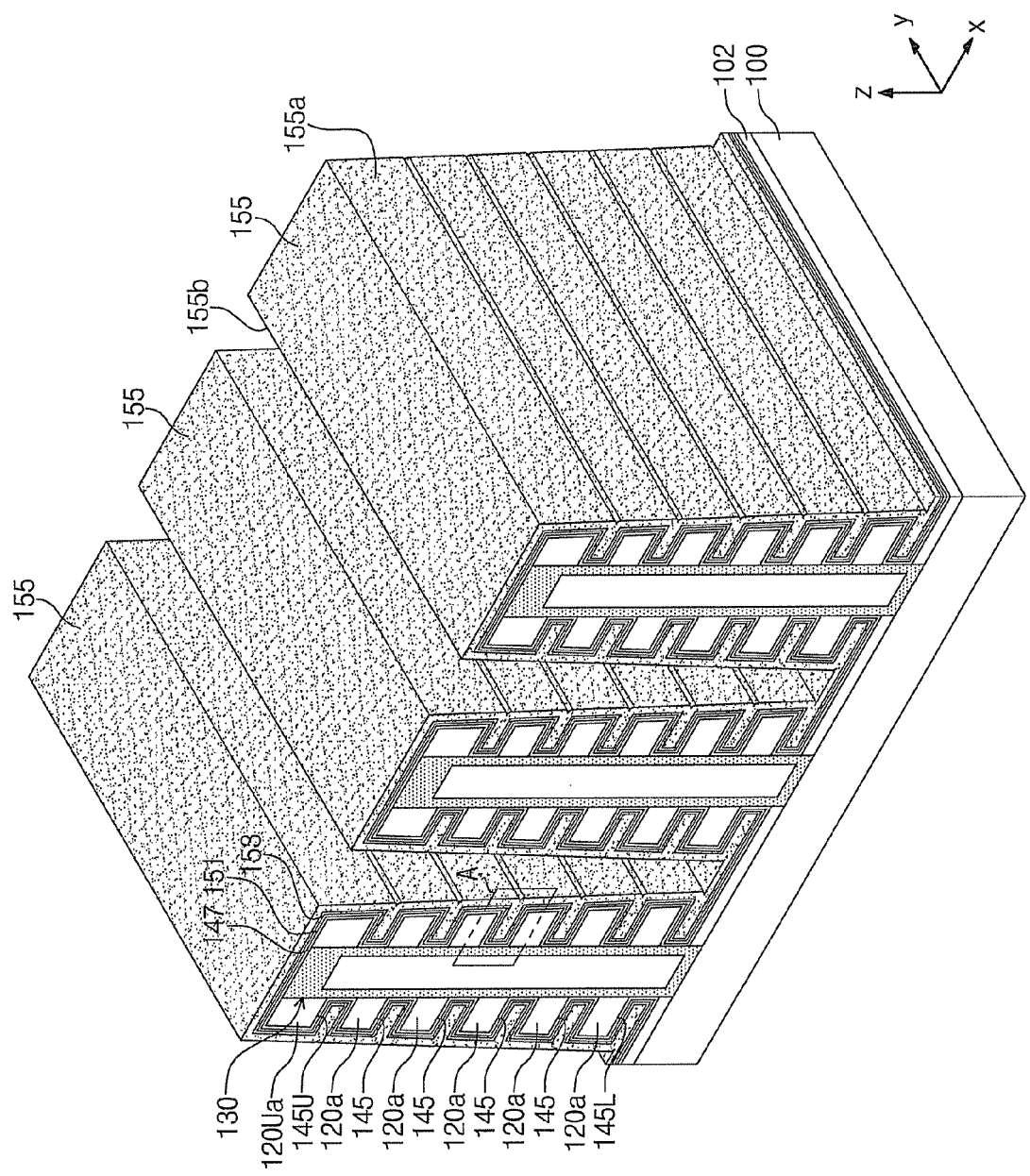

(not shown). Referring to FIG. 6, a data storage layer 147, a barrier layer 151 and first conductive layers 153 and 155 may be sequentially formed on the substrate including the gap regions 145L, 145 and 145U.

Figure 10:
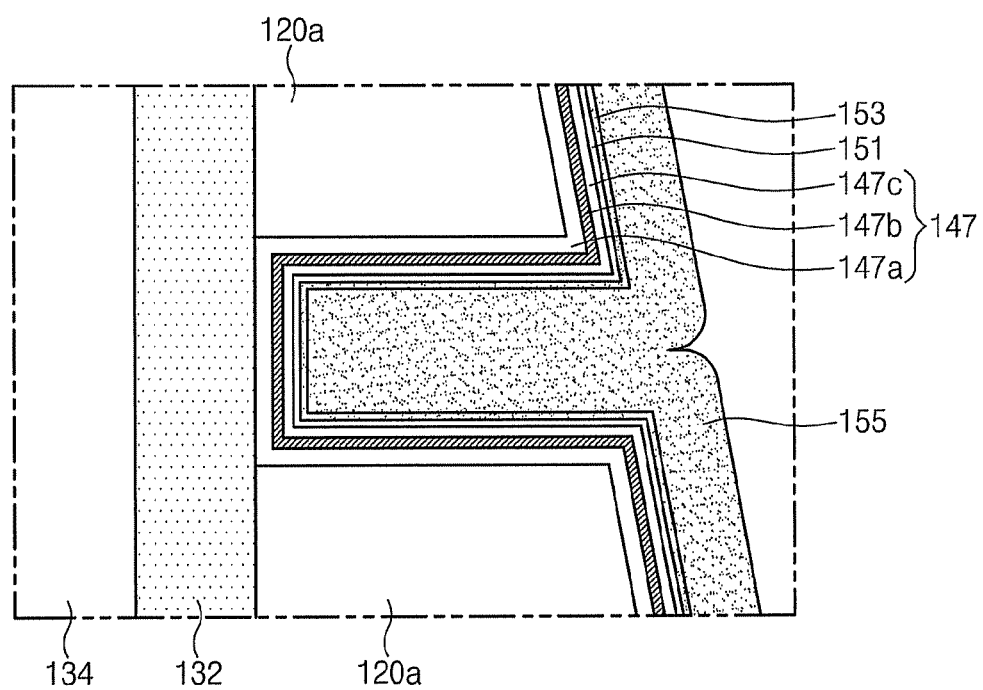

FIG. 10 is an enlarged diagram illustrating a portion 'A' of FIG. 6. Referring to FIGS. 6 and 10, the data storage layer 147 may be formed with a substantially uniform thickness along inner surfaces of the gap regions 145L, 145 and 145U. The data storage layer 147 may also be formed on a top surface of the buffer dielectric layer 102 and sidewalls of the insulation patterns 120a and 120Ua. The data storage layer 147 may be formed by sequentially stacking a tunnel insulation layer 147a, a charge storage layer 147b and a blocking layer 147c.

The tunnel insulation layer 147a may be formed to cover the exposed portions of the sidewalls of the semiconductor pillars 130. The tunnel insulation layer 147a may be a single-layered film or a multi-layered film. For example, the tunnel insulation layer 147a may include a silicon oxynitride layer, a silicon nitride layer, a silicon oxide layer and/or a metal oxide layer. The charge storage layer 147b may be separated from the semiconductor pillars 130 by the tunnel insulation layer 147a. The charge storage layer 147b may include charge trap sites which are capable of storing charges. For example, the charge storage layer 147b may include a silicon nitride layer, a metal nitride layer, a metal oxynitride layer, a metal silicate layer, a metal silicon oxynitride layer and/or a nano-dot layer.

The blocking layer 147c may be formed to cover the charge storage layer 147b. The blocking layer 147c may include, for example, a silicon oxide layer, a silicon nitride layer, a silicon oxynitride layer and/or a high-k dielectric layer. The high-k dielectric layer may include, for example, a metal oxide layer, a metal nitride layer and/or a metal oxynitride layer. The metal element contained in the high-k dielectric layer may be, for example, hafnium (Hf), zirconium (Zr), aluminum (Al), tantalum (Ta), lanthanum (La), cerium (Ce) and/or praseodymium (Pr). A dielectric constant of the blocking layer 147c may be greater than that of the tunnel insulation layer 147a.

Formation of the blocking layer 147c may be, for example, followed by formation of the barrier layer 151. The barrier layer 151 may be conformally formed along the inner surfaces of the gap regions 145L, 145 and 145U and the sidewalls of the insulation patterns 120a and 120Ua. The barrier layer 151 may reduce a possibility that atoms in the first conductive layers 153 and 155 diffuse into the data storage layer 147 and/or the semiconductor pillars 130. The barrier layer 151 may include, for example, a tungsten nitride (WN) layer and/or a titanium nitride (TiN) layer. A thickness of the barrier layer 151 may be, for example, about 50 Å.

The first conductive layers may include a seed layer 153 and a bulk layer 155. The seed layer 153 may be conformally formed along the inner surfaces of the gap regions 145L, 145 and 145U to provide empty spaces surrounded by the seed layer 153 in the gap regions 145L, 145 and 145U. The seed layer 153 may also be formed on the sidewalls of the insulation patterns 120a and 120Ua. The seed layer 153 may be formed using, for example, an atomic layer deposition (ALD) process that employs a diborane ($B_2H_6$) gas and a tungsten containing gas as process gases. The seed layer 153 may be formed to include an amorphous tungsten material. The tungsten containing gas may be, for example, a tungsten hexafluoride ($WF_6$) gas. According to at least one example embodiment, the seed layer 153 may be formed using, for example, an atomic layer deposition (ALD) process that employs a silane ($SiH_4$) gas and a tungsten containing gas as process gases.

The bulk layer 155 may be formed to, for example, completely fill the empty spaces surrounded by the seed layer 153 in the gap regions 145L, 145 and 145U. The bulk layer 155 may also be formed on the sidewalls of the insulation patterns 120a and 120Ua. The bulk layer 155 may be formed using the seed layer 153 as a nuclei generating layer. For example, the bulk layer 155 may be formed using a chemical vapor deposition (CVD) process that employs a hydrogen gas and a tungsten containing gas as process gases. In the event that the seed layer 153 may be formed using a diborane ($B_2H_6$) gas instead of a silane ($SiH_4$) gas, an average grain size of the bulk layer 155 may increase.

The first conductive layers 153 and 155 may be formed to a uniform thickness regardless of a level the first conductive layers 153 and 155 corresponding to a height from the substrate 100. Surfaces of the bulk layer 155 formed on a first sidewall 155a and a second sidewall 155b of each of the insulation structures may also have a sloped profile, similarly to the preliminary insulation structures. A distance along the x-axis between both top corners of the bulk layer 155 that may be formed on each insulation structure may be less than a distance along the x-axis between both bottom corners of the bulk layer 155 formed on each insulation structure.

Figure 7:
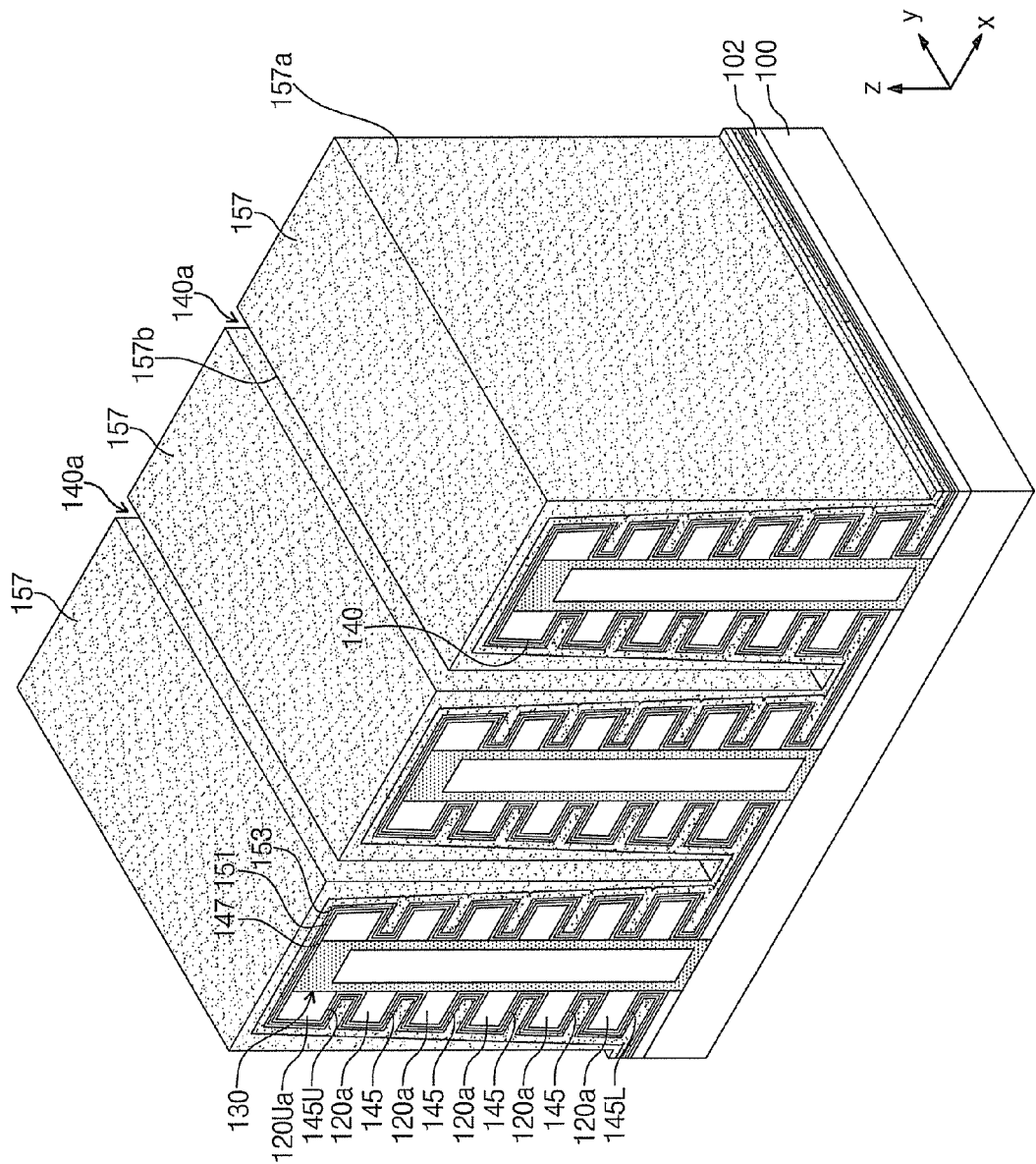

Referring to FIG. 7, a second conductive layer 157 may be formed on the substrate including the bulk layer 155. The second conductive layer 157 may be formed on the bulk layer 155. The second conductive layer 157 may be formed to cover the sidewalls of the insulation structures. A deposition rate of the second conductive layer 157 may be reduced toward the substrate 100 during formation of the second conductive layer. A thickness of the second conductive layer 157 that may be formed on upper portions of the insulation structures may be greater than a thickness of the second conductive layer 157 formed on lower portions of the insulation structures. A slope of both first and second sidewalls 157a and 157b of the second conductive layer 157 may be steeper than a slope of the first and second sidewalls 155a and 155b of the bulk layer 155. For example, the sidewalls 157a and 157b of the second conductive layer 157 may be perpendicular to a top surface of the substrate 100.

The second conductive layer 157 may be formed to have an average grain size which may be less than that of the bulk layer 155. A surface of the second conductive layer 157 may be smoother than a surface of the bulk layer 155. According to at least one example embodiment, the second conductive layer 157 may be formed of the same material as the first conductive layers 153 and 155. The second conductive layer 157 may include, for example, a tungsten layer. For example, the second conductive layer 157 may be formed using an atomic layer deposition (ALD) process that may employ a silane ($SiH_4$) gas and a tungsten containing gas as process gases. The tungsten containing gas may be, for example, a tungsten hexafluoride ($WF_6$) gas.

According to at least one example embodiment, the second conductive layer 157 may be formed of a different material from the first conductive layer 153 and 155. The first conductive layer 153 and 155 and the second conductive layer 157 may exhibit substantially the same etch rate with respect to a specific etch process. For example, when the first conductive layers 153 and 155 are formed of a tungsten layer, the second conductive layer 157 may be formed of a titanium nitride (TiN) layer with substantially the same etch rate as the first conductive layer 153 and 155 with respect to the specific etch process. In this case, the second conductive layer 157 may be formed using, for example, an atomic layer deposition (ALD) process that employs a titanium tetrachloride ($TiCl_4$) gas and an ammonia ($NH_3$) gas as process gas, and the specific etch process may be performed using a chlorine ($Cl_2$) gas and a carbon tetrafluoride (CF4) gas as an etch gas.

Empty spaces 140a that may be surrounded by the second conductive layer 157 may be provided in the trenches 140. A width of each of the empty spaces 140a may be a substantially uniform width (e.g., a distance along the x-axis) regardless of a height from the substrate 100. An upper width of one of the empty spaces 140a may be substantially equal to a lower width thereof.

Figure 8:
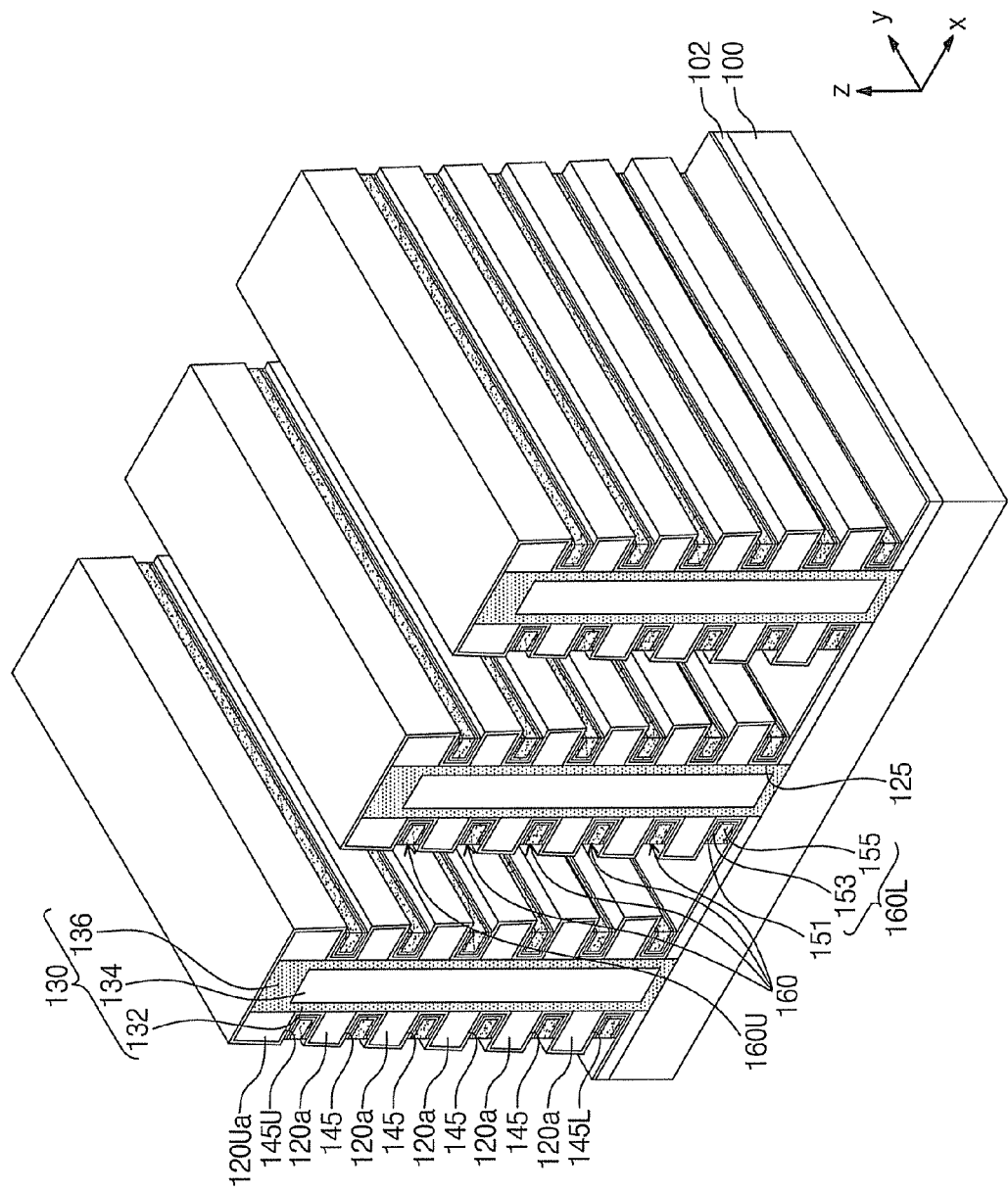

Referring to FIG. 8, the barrier layer 151 and the first and second conductive layers 153, 155 and 157 may be partially removed after formation of the second conductive layer 157. For example, the barrier layer 151 and the first and second conductive layers 153, 155 and 157 formed outside the gap regions 145L, 145 and 145U may be completely removed. According to at least one example embodiment (not shown) the data storage layer 147 that is formed outside the gap regions 145L, 145 and 145U may also be removed while the barrier layer 151 and the first and second conductive layers 153, 155 and 157 are partially removed.

After the barrier layer 151, and the first and second conductive layers 153, 155 and 157 are partially removed, a portion of the first conductive layers 153 and 155 and a portion of the barrier layer 151 may remain in each of the gap regions 145L, 145 and 145U. The remaining portions of the first conductive layer 153 and 155 may act as gate electrodes 160L, 160 and 160U.

The gate electrodes 160L, 160 and 160U and the insulation patterns 120a and 120Ua, which may be alternately stacked between the pair of adjacent trenches, may constitute a memory stack structure. The memory stack structures may be arrayed in the first direction (e.g., the x-axis direction) and separated from each other, and memory stack structures may extend in the second direction (e.g., the y-axis direction). The lowermost gate electrodes 160L of the gate electrodes may correspond to gates of lower selection transistors, and the uppermost gate electrodes 160U of the gate electrodes may correspond to gates of upper selection transistors. The gate electrodes 160 between the lowermost gate electrodes 160L and the uppermost gate electrodes 160U may correspond to control gates of memory cells.

The barrier layer 151 and the first and second conductive layers 153, 155 and 157 that are formed outside the gap regions 145L, 145 and 145U may be removed using, for example, a wet etch process and/or a dry etch process. For example, in the event that the barrier layer 151, the first conductive layer 153 and 155 and the second conductive layer 157 are formed of a titanium nitride (TiN) layer, a tungsten layer and a titanium nitride (TiN) layer, respectively, the barrier layer 151, the first conductive layer 153 and 155 and the second conductive layer 157 may be partially removed using an etch recipe with a characteristic that the tungsten layer and the titanium nitride (TiN) layer may be etched at substantially the same etch rate.

The thickness of the second conductive layer 157 on the upper portions of the insulation structures may be greater than that of the second conductive layer 157 on the lower portions of the insulation structures. While the first and second conductive layers 153, 155 and 157 may be partially etched, the first conductive layer 153 and 155 in the gap regions that may be located at a relatively high level may be less over-etched than the first conductive layer 153 and 155 in the gap regions that may be located at a relatively low level. A thickness of all the gate electrodes 160L, 160 and 160U may be a uniform width and semiconductor device reliability may be increased.

If the process for aiming the second conductive layer 157 is omitted and the first conductive layer 153 and 155 are isotropically etched to form gate electrodes, widths (e.g., distances along the x-axis) of the gate electrodes remaining in the gap regions 145L, 145 and 145U may be different from each other. The upper width of the insulation structure may be less than the lower width thereof and the first conductive layer 153 and 155 may be fanned to a uniform thickness, as described with reference to FIGS. 5 and 6. In the event that the first conductive layer 153 and 155 is isotropically etched, a width (e.g., a distance along the x-axis) of the first conductive layer 153 and 155 remaining in a gap region located at a relatively high level may be less than that of the first conductive layer 153 and 155 remaining in a gap region located at a relatively low level. In this case, widths of the gate electrodes may be different from each other according to their heights from the substrate 100. Reliability of the semiconductor device may be degraded.

According to example embodiments, all the gate electrodes 160L, 160 and 160U may be formed to a uniform width because of the presence of the second conductive layer 157. A high and/or improved reliability semiconductor device may be realized.

Referring to FIG. 8, after formation of the gate electrodes 160L, 160 and 160U, each of the gap regions 145L, 145 and 145U may include an empty region that may not be filled with one of the gate electrodes. The gap regions 145L, 145 and 145U may include recessed regions which may be laterally etched during the isotropic etch process for forming the gate electrodes. A width of the gap region located at a relatively high level may be less than that of the gap region that may be located at a relatively low level. In the event that the first and second conductive layers 153, 155 and 157 are isotropically etched to form the gate electrodes, a width of the recessed region in the gap region that may be located at a relatively high level may be less than that of the recessed region in the gap region that may be located at a relatively low level.

Figure 9:
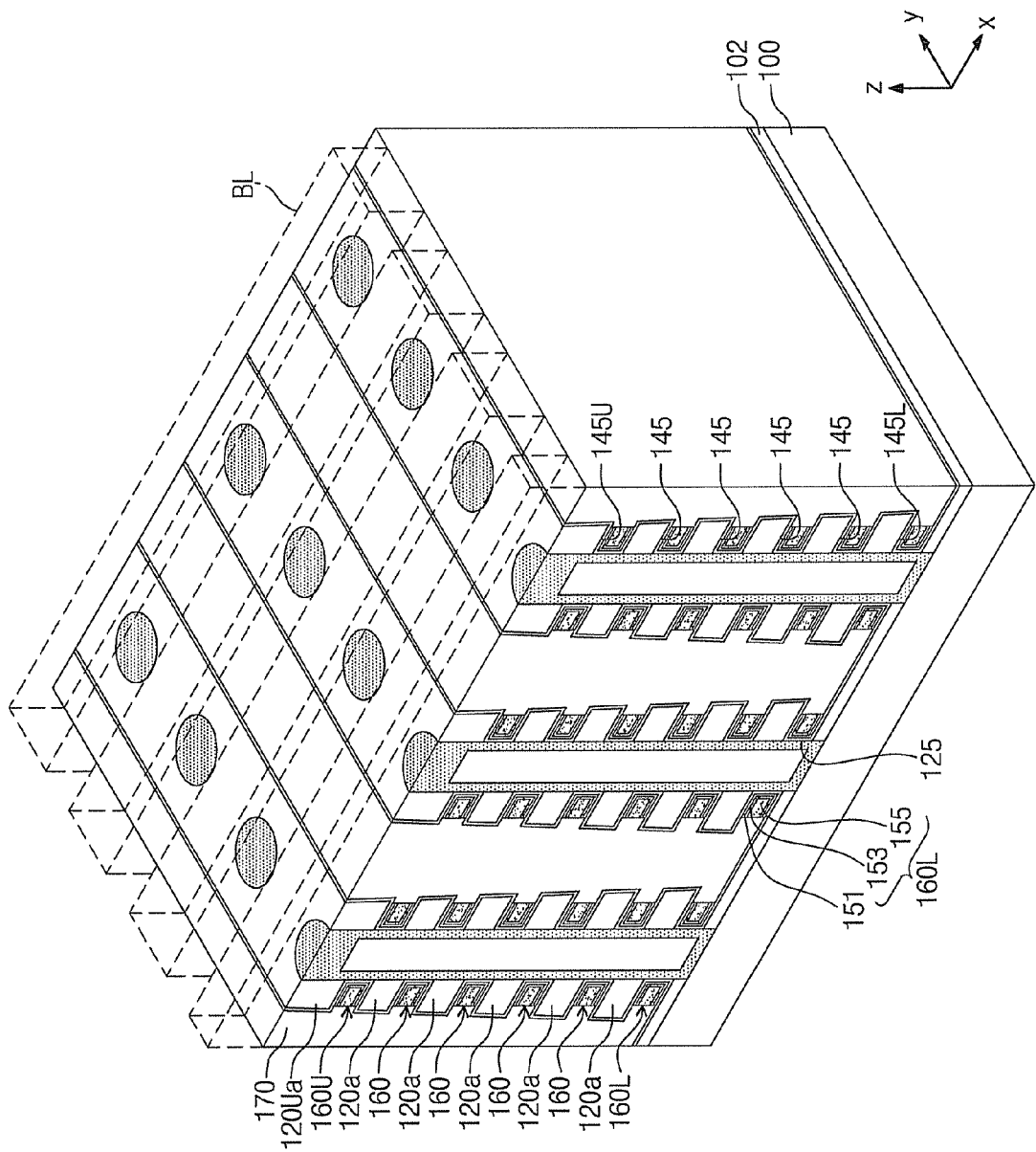

Referring to FIG. 9, isolation patterns 170 may be formed to fill the trenches 140 and the recessed regions. Forming the isolation patterns 170 may include forming an isolation layer on the substrate including the gate electrodes 160L, 160 and 160U and, for example, planarizing the isolation layer using the data storage layer 147 on the uppermost insulation patterns 120Ua as a planarization stop layer. The isolation patterns 170 may include an insulation layer. For example, the isolation patterns 170 may include a high density plasma (HDP) oxide layer, a spin on glass (SOG) layer and/or a chemical vapor deposition (CVD) oxide layer.

After forming the isolation patterns 170, the data storage layer 147 on the uppermost insulation patterns 120Ua may be etched to expose the uppermost insulation patterns 120Ua. The drain regions 136 may also be exposed together with the uppermost insulation patterns 120Ua. Bit lines BL may be formed on the substrate including the isolation patterns 170 and the exposed drain regions 136. The bit lines BL may be electrically connected to the drain regions 136. The bit lines BL may be formed to extend in the first direction (e.g., the x-axis direction).

The bit lines BL may be formed directly on the uppermost insulation patterns 120Ua and the drain regions 136. According to at least one example embodiment, before forming the bit lines BL, an interlayer dielectric layer (not shown) may be formed on the substrate including the isolation patterns 170 and the exposed uppermost insulation patterns 120Ua, and the bit lines BL may be formed on the interlayer dielectric layer. The bit lines BL may be electrically connected to the drain regions 136 through contact plugs (not shown) penetrating the interlayer dielectric layer.

FIG. 9 illustrates a semiconductor device according to example embodiments. Referring to FIG. 9, a substrate 100 may be provided. The substrate 100 may be a semiconductor substrate. For example, the substrate 100 may be a silicon substrate, a germanium substrate, a silicon-germanium substrate and/or a compound semiconductor substrate. The substrate 100 may be doped with dopants of a first conductivity type.

A plurality of memory stack structures may be arrayed in a first direction on the substrate 100. Each of the memory stack structures may include insulation patterns 120a and 120Ua which are sequentially stacked and vertically separated from each other on the substrate 100. Spaces between the insulation patterns 120a and 120Ua sequentially stacked may correspond to gap regions 145U, 145 and 145L. The lowermost gap region 145L of the gap regions may be defined as being between the lowermost insulation pattern 120a and a buffer dielectric layer 102 under the lowermost insulation pattern 120a, and the uppermost gap region 145U of the gap regions may be defined as being between the uppermost insulation pattern 120Ua and the insulation pattern 120a disposed under the uppermost insulation pattern 120Ua. The gap regions 145 may be defined as being between the insulation patterns 120a vertically adjacent to each other.

In each memory stack structure, a width (e.g., a distance along a first direction) of the insulation pattern that may be located at a relatively high level may be less than a width (e.g., a distance along the first direction) of the insulation pattern that may be located at a relatively low level. In FIG. 9, the first direction may be parallel with an x-axis. The first direction may correspond to an x-axis direction. A width (e.g., a distance along the first direction) of the gap region that may be located at a relatively high level may be less than a width (e.g., a distance along the first direction) of the gap region that may be located at a relatively low level.

At least a portion of each of the gap regions 145L, 145 and 145U may be filled with a gate electrode 160L, 160 or 160U. According to at least one example embodiment, a width of each of the gate electrodes 160L, 160 and 160U may be substantially the same width (e.g., a distance along the x-axis) regardless of a level at which the gate electrodes 160L, 160 and 160U are relative to the substrate 100. If a first gate electrode of the gate electrodes is located at a higher level than a second gate electrode of the gate electrodes, a volume ratio of the first gate electrode to a first gap region accommodating the first gate electrode may be higher than a volume ratio of the second gate electrode to a second gap region accommodating the second gate electrode.

The gate electrodes 160L, 160 and 160U sequentially stacked on the substrate 100 may also constitute one of the memory stack structures. Each of the memory stack structures may include the gate electrodes 160L, 160 and 160U and the insulation patterns 120a and 120Ua which may be alternately stacked on the substrate 100. The memory stack structures may be separated from each other in the first direction. The gate electrodes 160L, 160 and 160U and the insulation patterns 120a and 120Ua may be parallel with a top surface of the substrate 100 and may extend in a second direction perpendicular to the first direction. The second direction may be parallel with a y-axis. The second direction may correspond to a y-axis direction.

The insulation patterns 120a and 120Ua may include, for example, an oxide material. For example, the insulation patterns 120a and 120Ua may include a silicon oxide. Each of the gate electrodes 160L, 160 and 160U may include a seed layer 153 and a bulk layer 155. The seed layer 153 and the bulk layer 155 may include one or more conductive materials.

For example, the conductive material that may be used as the seed layer 153 and the bulk layer 155 may include at least one of a metal layer (e.g., a tungsten layer, an aluminum layer, a titanium layer and/or a tantalum layer), a conductive metal nitride layer (e.g., a titanium nitride layer and/or a tantalum nitride layer), and a doped semiconductor layer (e.g., a doped silicon layer, a doped germanium layer and/or a doped silicon-germanium layer).

Isolation patterns 170 may be disposed between the memory stack structures. One of the isolation patterns 170 may be on the substrate 100 at a side of the gate electrodes 160L, 160 and 160U and the insulation patterns 120a and 120Ua which may be alternately stacked. The isolation patterns 170 may include, for example, an insulation material. The gate electrodes 160L, 160 and 160U may partially fill the gap regions 145L, 145 and 145U, respectively. Each of the gap regions 145L, 145 and 145U may include an empty region that may not be filled with one of the gate electrodes 160L, 160 and 160U. The gap regions 145L, 145 and 145U may include recessed regions corresponding to undercut regions. The undercut regions may be filled with insulation materials corresponding to extensions of the isolation patterns 170.

While a width of the gap region that may be located at a relatively high level may be less than that of the gap region that may be located at a relatively low level, a width of all of the gate electrodes 160L, 160 and 160U may be substantially the same width with respect to each other (e.g., a distance along the x-axis) regardless of the their levels relative to the substrate 100. A width of the isolation pattern extending into the gap region located at a relatively high level may be less than that of the isolation pattern extending into the gap region located at a relatively low level. If a first gap region of the gap regions is located at a higher level than a second gap region of the gap regions, a volume ratio of the isolation pattern in the first gap region to the first gap region may be lower than a volume ratio of the isolation pattern in the second gap region to the second gap region.

As illustrated in FIG. 8, semiconductor pillars 130 may penetrate each memory stack structure including the gate electrodes 160L, 160 and 160U and the insulation patterns 120a and 120Ua which may be alternately stacked. The semiconductor pillars 130 may be in a bar shape extending in a third direction perpendicular to the first and second directions. The third direction may correspond to a direction perpendicular to the top surface of the substrate 100. The third direction may be parallel with a z-axis, as illustrated in FIG. 8. The semiconductor pillars 130 may contact the substrate 100. The number of the semiconductor pillars 130 that may be in each memory stack structure may be, for example, two or more. The semiconductor pillars 130 penetrating the plurality of memory stack structures may be two dimensionally arrayed along the first and second directions with respect to a plan view. The semiconductor pillars 130 penetrating each of the memory stack structures may be arrayed and separated along the second direction as seen in a plan view.

Each of the semiconductor pillars 130 may include a semiconductor layer 132 covering an inner surface in a channel opening 125 penetrating the gate electrodes 160L, 160 and 160U and the insulation patterns 120a and 120Ua which may be alternately stacked. A filling insulation pattern 134 filing a space surrounded by the semiconductor layer 132 in the channel opening 125, and a drain region 136 filling the channel opening 125 on the filling insulation pattern 134. The drain region 136 may include, for example, the same material as the semiconductor layer 132. The drain region 136 may be doped with dopants of a second conductivity type. The filling insulation pattern 134 may be formed of an insulation material, for example, a silicon oxide layer.

Each of the gate electrodes 160L, 160 and 160U may include a first sidewall adjacent to the semiconductor pillar 130 and a second sidewall opposite the first sidewall. As described above, the widths (e.g., a distance along the first direction) of the gate electrodes 160L, 160 and 160U in each memory stack structure may be substantially equal to each other. The second sidewalls of the gate electrodes 160L, 160 and 160U in each memory stack structure may be located in a vertical flat plane. According to at least one example embodiment, the vertical flat plane may be perpendicular to the top surface of the substrate 100.

A barrier layer 151 may be disposed between the first sidewalls of the gate electrodes 160L, 160 and 160U and the semiconductor pillars 130 adjacent thereto. The barrier layer 151 may include, for example, a titanium nitride layer and/or a tungsten nitride layer. A data storage layer 147 may be between the gate electrodes 160L, 160 and 160U and the semiconductor pillars 130 adjacent thereto. The data storage layer 147 may be between the barrier layer 151 and the sidewalls of the semiconductor pillars 130. The data storage layer 147 may include a tunnel insulation layer 147a, a charge storage layer 147b and a blocking layer 147c, for example, as described with reference to FIG. 10.

The data storage layer 147 between the gate electrodes 160 and the semiconductor pillars 130 may act as data storage elements of memory cells. The data storage layer 147 between the lowermost gate electrodes 160L and the semiconductor pillars 130 may act as gate insulation layers of lower selection transistors, and the data storage layer 147 between the uppermost gate electrodes 160U and the semiconductor pillars 130 may act as gate insulation layers of upper selection transistors. One of the semiconductor pillars 130, the gate electrodes 160L, 160 and 160U surrounding the semiconductor pillar 130, and the data storage layer 147 between the semiconductor pillar 130 and the gate electrodes 160L, 160 and 160U may constitute a single vertical cell string.

The vertical cell string may include a lower selection transistor, a plurality of memory cells and an upper selection transistor which are serially and vertically connected to each other. The lowermost gate electrode 160L of the gate electrodes may correspond to a gate of the lower selection transistor, and the uppermost gate electrode 160U of the gate electrodes may correspond to a gate of the upper selection transistor. The gate electrodes 160 between the lowermost gate electrode 160L and the uppermost gate electrode 160U may correspond to gates of the memory cells, respectively. Although two selection transistors and four memory cells are depicted in FIG. 9, the number of each may vary according to design. The string may also include, for example, dummy memory cells and the like.

The uppermost gate electrodes 160U of the plurality of memory stack structures may be electrically isolated from each other. The gate electrodes 160 located at the same level from the substrate 100 may be electrically connected to each other, and the lowermost gate electrodes 160L of the plurality of memory stack structures may also be electrically connected to each other. Common source regions (not shown) may be, for example, in the substrate 100 under the isolation patterns 170. The common source regions may be line shaped and may extend in the second direction (e.g., the y-axis direction). The common source regions may be doped with dopants of the second conductivity type. The electrical connection between the common source regions and the semiconductor pillars 130 may be controlled by an electrical bias applied to the lowermost gate electrodes 160L.

Bit lines BL may be disposed on the drain regions 136 and the isolation patterns 170. The bit lines BL may be electrically connected to the drain regions 136. The electrical connections between the bit lines BL and the vertical cell strings may be controlled by electrical biases applied to the uppermost gate electrodes 160U. The bit lines BL may extend in the first direction (e.g., the x-axis direction). The bit lines BL may cross over the gate electrodes 160L, 160 and 160U. The bit lines BL may be in parallel with each other. Each of the bit lines BL may be electrically connected to the drain regions 136 of the semiconductor pillars 130 which may be arrayed in the first direction (e.g., the x-axis direction) to constitute a single row. The bit lines BL may be directly connected to the drain regions 136. According to at least one example embodiment, the bit lines BL may be on an interlayer dielectric layer covering the uppermost insulation patterns 120Ua and the isolation patterns 170. In this case, the bit lines BL may be electrically connected to the drain regions 136 through contact plugs penetrating the interlayer dielectric layer.

The semiconductor devices according to the example embodiments may be encapsulated using various packaging techniques. For example, the semiconductor devices according to example embodiments may be encapsulated using, for example, a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and/or a wafer-level processed stack package (WSP) technique. The package in which the semiconductor device, according to one of the above example embodiments, may be mounted may further include at least one additional semiconductor device (e.g., a controller and/or a logic device) that may control the semiconductor device.

Figure 11:
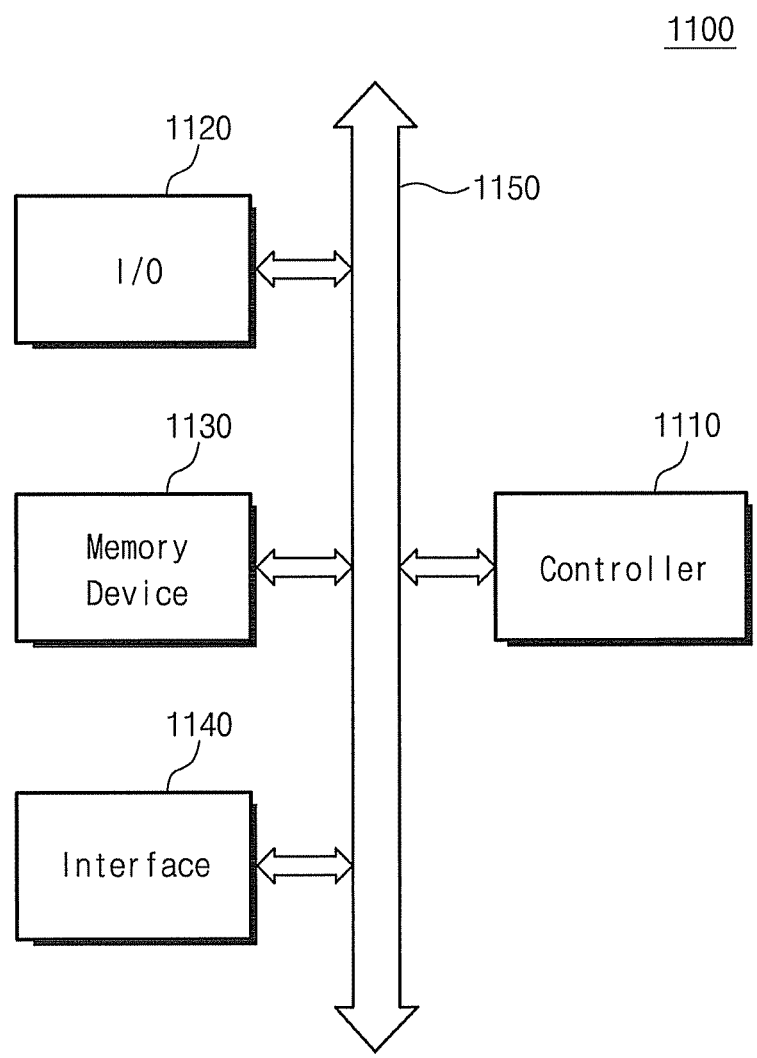

FIG. 11 is a schematic block diagram illustrating electronic systems including semiconductor devices according to the example embodiments. Referring to FIG. 11, an electronic system 1100 according to at least one example embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals may be transmitted.

The controller 1110 may include a microprocessor, a digital signal processor (DSP), a microcontroller and/or a logic device. The logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices according to the example embodiments described with respect to FIGS. 1-10. The memory device 1130 may include other types of semiconductor memory devices which may be different from the semiconductor devices according to example embodiments. For example, the memory device 1130 may include a magnetic memory device, a phase change memory device, a dynamic random access memory (DRAM) device and/or a static random access memory (SRAM) device.

The interface unit 1140 may transmit electrical data to a communication network and/or may receive electrical data from a communication network. The interface unit 1140 may operate by wireless and/or cable. For example, the interface unit 1140 may include an antenna for wireless communication and/or a transceiver for cable communication. Although not shown, the electronic system 1100 may further include a fast DRAM device and/or a fast SRAM device which may act as a cache memory for improving an operation of the controller 1110.

An electronic system 1100 may be applied to a personal digital assistant (PDA), a portable computer, a web tablet, a wireless phone, a mobile phone, a digital music player and/or a memory card. The electronic system 1100 may be applied to other electronic products that may receive and/or transmit information data wirelessly.

Figure 12:
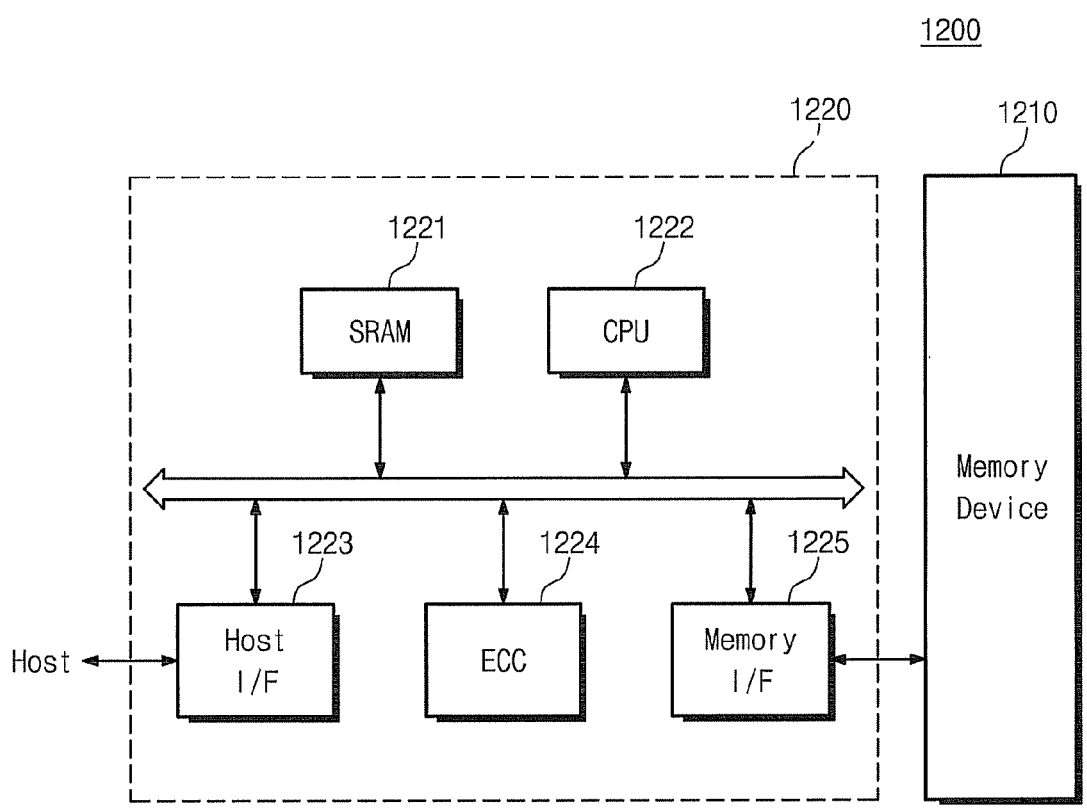

FIG. 12 is a schematic block diagram illustrating memory cards including semiconductor devices according to example embodiments. Referring to FIG. 12, a memory card 1200 according to at least one example embodiment may include a memory device 1210. The memory device 1210 may include at least one of the semiconductor devices according to the example embodiments described with respect to FIGS. 1-10. The memory device 1210 may include other types of semiconductor memory devices which may be different from the semiconductor devices according to example embodiments. For example, the memory device 1210 may include a magnetic memory device, a phase change memory device, a dynamic random access memory (DRAM) device and/or a static random access memory (SRAM) device.

The memory card 1200 may include a memory controller 1220 that may control data communication between a host and the memory device 1210. The memory controller 1220 may include a central processing unit (CPU) 1222 that may control overall operations of the memory card 1200. The memory controller 1220 may include an SRAM device 1221 that may be used as an operation memory of the CPU 1222. The memory controller 1220 may include a host interface unit 1223 and a memory interface unit 1225. The host interface unit 1223 may be configured to include a data communication protocol between the memory card 1200 and the host.

The memory interface unit 1225 may connect the memory controller 1220 to the memory device 1210. The memory controller 1220 may include an error check and correction (ECC) block 1224. The ECC block 1224 may detect and correct errors of data which may be read out from the memory device 1210. The memory card 1200 may include a read only memory (ROM) device (not shown) that may store code data to interface with the host. A memory card 1200 may be used as, for example, a portable data storage card. According to at least one example embodiment, the memory card 1200 may replace hard disks of computer systems as solid state disks of the computer systems.

According to example embodiments, an insulation structure including a plurality of insulation patterns that are sequentially stacked may be formed on a substrate. The insulation patterns of the insulation structure may be separated from each other to provide gap regions between the insulation patterns. A first conductive layer may be formed to fill the gap regions and to cover sidewalls of the insulation structure, and a second conductive layer may be formed on the first conductive layer. A thickness of the second conductive layer covering an upper portion of the insulation structure may be greater than that of the second conductive layer covering a lower portion of the insulation structure. Even though the insulation structure may be formed with positive sloped sidewalls, a width of gate electrodes formed in the gap regions by isotropically etching the second and first conductive layers may be uniform regardless of their distance from the substrate. A high and/or improved reliability semiconductor device may be realized.

While example embodiments have been particularly shown and described, it will be understood by one of ordinary skill in the art that variations in form and detail may be made therein without departing from the spirit and scope of the claims.

What is claimed is:

1. A method of fabricating a semiconductor device, the method comprising:
    forming an insulation structure having a first end and a second end, the second end stacked on a substrate such that the second end is closer to the substrate than the first end, the insulation structure including vertically stacked insulation patterns stacked from the first end to the second end such that a thickness of the insulation structure at the second end is greater than a thickness of the insulation structure at the first end, the vertically stacked insulation patterns separated from each other by gap regions;
    forming a first conductive layer in the gap regions and on a sidewall of the insulation structure; and
    forming a second conductive layer covering the first conductive layer such that a thickness of the second conductive layer at the first end is greater than a thickness of the second conductive layer at the second end by depositing a material of the second conductive layer at a deposition rate that varies along the sidewall of the insulation structure, the deposition rate being greater at the first end than at the second end.

2. The method of claim 1, wherein:
    the forming an insulation structure includes forming the sidewall of the insulation structure with a sloped profile such that a first width of the insulation structure at the first end is less than a second width of the insulation structure at the second end; and
    the forming a second conductive layer includes forming the second conductive layer with a steeper slope than the sidewall.

3. The method of claim 1, wherein the forming a first conductive layer includes forming the first conductive layer to completely fill the gap regions.

4. The method of claim 1, further comprising:
    forming a barrier layer in the gap regions prior to the forming a first conductive layer,
    wherein the barrier layer includes a same material as the second conductive layer.

5. The method of claim 1, wherein the forming an insulation structure includes:
    forming the insulation structure on a substrate by alternating between deposition of one of a plurality of insulation layers and one of a plurality of sacrificial layers a plurality of times;
    patterning the insulation layers and the sacrificial layers to form at least one trench, the insulation patterns and sacrificial patterns; and
    removing the sacrificial patterns to form the gap regions.

6. The method of claim 5, further comprising:
    forming a semiconductor pillar through the insulation layers and the sacrificial layers to contact the substrate prior to the patterning of the insulation layers and the sacrificial layers; and forming a data storage layer in the gap regions prior to the forming a first conductive layer.

7. A method of manufacturing a semiconductor device, comprising:
stacking at least three vertically separated first insulation layers on a substrate layer;
forming a plurality of vertical channels through the first insulation layers;
removing a portion of the first insulation layers between the vertical channels to form a plurality of insulation patterns that decrease in width as a function of distance from the substrate layer;
forming a plurality of gate layers on the vertical channels and the insulation patterns to form a plurality of tapered vertical structures;
forming a sacrificial layer that increases in width as a function of distance from the substrate layer on the tapered vertical structures; and
removing at least a portion of the sacrificial layer and at least one of the gate layers at about a same rate to form a plurality of gate electrodes of about a same width between the insulation patterns.

8. The method of claim 7, wherein the forming of the sacrificial layer includes depositing the sacrificial layer at a deposition rate that increases as a function of distance from the substrate layer.

9. The method of claim 7, further comprising:
forming a second insulation layer on the gate electrodes,
wherein the removing at least a portion includes completely removing the sacrificial layer and removing the at least one gate layer until a recess is formed between adjacent insulation layer patterns, and
the second insulation layer fills the recess.

10. The method of claim 7, wherein the forming a sacrificial gate layer on the tapered vertical structures forms a plurality of substantially non-tapered vertical structures.

11. A method of fabricating a semiconductor device, the method comprising:
forming an insulation structure having a first end and a second end, the second end stacked on a substrate such that the second end is closer to the substrate than the first end, the insulation structure including vertically stacked insulation patterns stacked from the first end to the second end such that a thickness of the insulation structure at the second end is greater than a thickness of the insulation structure at the first end, the vertically stacked insulation patterns separated from each other by gap regions;
forming a first conductive layer in the gap regions and on a sidewall of the insulation structure;
forming a second conductive layer covering the first conductive layer such that a thickness of the second conductive layer at the first end is greater than a thickness of the second conductive layer at the second end by depositing a material of the second conductive layer at a deposition rate that varies along the sidewall of the insulation structure, the deposition rate being greater at the first end than at the second end; and
forming a third conductive layer as a seed layer between the first conductive layer and the insulation structure using an atomic layer deposition (ALD) process such that the third conductive layer covers surfaces inside the gap regions, wherein
the first and second conductive layers include a same material,
the forming a first conductive layer includes forming the first conductive layer as a bulk layer on the third conductive layer such that the first conductive layer fills the gap regions, and
the forming a second conductive layer includes forming the second conductive layer using an ALD process.

12. The method of claim 11, wherein the forming a second conductive layer includes using different process gases than the forming a third conductive layer.

13. The method of claim 11, further comprising:
isotropically etching the first, second and third conductive layers to form a plurality of gate electrodes each filling at least a portion of a different one of the gap regions.

14. The method of claim 13, wherein the first conductive layer includes a different material from the second conductive layer.

15. The method of claim 13, wherein the isotropically etching includes etching the first and second conductive layers at substantially a same etch rate.

16. The method of claim 13, wherein the isotropically etching includes forming an empty region in each of the gap regions such that a width of the empty regions increases as a function of distance from the first end.

* * * * *